United States Patent
Burney et al.

(10) Patent No.: US 7,555,667 B1
(45) Date of Patent: Jun. 30, 2009

(54) PROGRAMMABLE LOGIC DEVICE INTEGRATED CIRCUIT WITH DYNAMIC PHASE ALIGNMENT CAPABILITIES AND SHARED PHASE-LOCKED-LOOP CIRCUITRY

(75) Inventors: Ali Burney, Fremont, CA (US); Yu Xu, Palo Alto, CA (US); Leon Zheng, Santa Clara, CA (US); Sanjay K. Charagulla, San Jose, CA (US)

(73) Assignee: Altera Corporation, San Jose, CA (US)

( * ) Notice: Subject to any disclaimer, the term of this patent is extended or adjusted under 35 U.S.C. 154(b) by 505 days.

(21) Appl. No.: 11/488,365

(22) Filed: Jul. 17, 2006

Related U.S. Application Data

(60) Provisional application No. 60/790,272, filed on Apr. 7, 2006.

(51) Int. Cl.
*G06F 1/04* (2006.01)
*G06F 1/06* (2006.01)
(52) U.S. Cl. .................. 713/401; 713/501; 713/503
(58) Field of Classification Search ............... 713/400, 713/401, 501, 503, 600
See application file for complete search history.

(56) References Cited

U.S. PATENT DOCUMENTS

| | | | |
|---|---|---|---|
| 6,985,096 B1 | 1/2006 | Sasaki et al. | |
| 7,003,423 B1 | 2/2006 | Kabani et al. | |
| 7,034,597 B1* | 4/2006 | Mo et al. | 327/276 |
| 7,075,365 B1 | 7/2006 | Starr et al. | |
| 7,340,021 B1* | 3/2008 | Churchill et al. | 375/354 |

| | | | |
|---|---|---|---|
| 2001/0033188 A1 | 10/2001 | Aung et al. | |
| 2004/0258410 A1* | 12/2004 | Yajima et al. | 398/71 |
| 2005/0117517 A1* | 6/2005 | DeCusatis et al. | 370/235 |

OTHER PUBLICATIONS

"Stratix II GX Transceiver Block Overview" Stratix II GX Device Handbook, vol. 2, pp. 1-1 to 1-8, Altera Corporation, Feb. 2006.
"Stratix II BX Physical Coding Sub-Layer", pp. 1-3 printed from ww.altera.com on Mar. 21, 2006, Altera Corporation.
"Stratix II GX Transceiver FPGAs Physical Medium Attachment Layer", pp. 1 and 2, printed from www.altera.com on Mar. 21, 2006, Altera Corporation.
"Source Synchronous Signaling in Stratix II Devices", pp. 1 and 2, printed from www.altera.com on Mar. 21, 2006, Altera Corporation.

* cited by examiner

*Primary Examiner*—Dennis M Butler
(74) *Attorney, Agent, or Firm*—Treyz Law Group; G. Victor Treyz

(57) ABSTRACT

Adjustable transceiver circuitry is provided for programmable integrated circuits. The transceiver circuitry has a dynamic phase alignment circuit that can be used for aligning clock and data signals. The transceiver circuitry supports a phase-locked-loop source synchronous mode that can be used to receive data from transmitting integrated circuits that are clocked with a common clock. Each transmitting integrated circuit transmits a clock and associated data signals over a bus. The transceiver circuitry uses a master-slave architecture. A master dynamic phase alignment circuit in each transceiver receives the clock for that bus and selects a corresponding optimal clock phase to use in receiving input data for the bus from a multiphase clock. The master dynamic phase alignment circuit in each transceiver distributes the optimal clock phase to associated slave dynamic phase alignment circuits. Only a single phase-locked loop circuit is need to generate the multiphase clock.

20 Claims, 10 Drawing Sheets

PROGRAMMABLE LOGIC DEVICE INTEGRATED CIRCUIT WITH DYNAMIC PHASE ALIGNMENT CAPABILITIES AND SHARED PHASE-LOCKED-LOOP CIRCUITRY

This application claims the benefit of provisional patent application No. 60/790,272, filed Apr. 7, 2006, which is hereby incorporated by reference herein in its entirety.

BACKGROUND

This invention relates to integrated circuits such as programmable logic device integrated circuits, and more particularly, to programmable logic device integrated circuits with dynamic phase alignment circuits.

Programmable logic devices are a type of integrated circuit that can be programmed by a user to implement a desired custom logic function. In a typical scenario, a logic designer uses computer-aided design tools to design a custom logic circuit. When the design process is complete, the tools generate configuration data. The configuration data is loaded into a programmable logic device to configure the device to perform the functions of the custom logic circuit.

In a typical system, a programmable logic device integrated circuit and other integrated circuits are mounted on a circuit board. The circuit board contains conductive paths that interconnect the integrated circuits. A system may also have paths that interconnect integrated circuits on different boards. Programmable logic devices contain transceiver circuitry for transmitting and receiving data over these communications paths.

Programmable logic device transceiver circuitry includes input and output drivers. The input and output drivers may use differential signaling schemes in which a pair of signals are referenced to each other or single-ended signaling schemes in which signals are referenced to ground. In high-speed environments, the input and output drivers are generally differential drivers and handle differential signals.

In source-synchronous system architectures, multiple transmitters share a common clock. Each transmitter may transmit data signals and a clock signal over a respective bus. A programmable logic device may receive and process the signals on each bus. With conventional arrangements, programmable logic devices use numerous phase-locked-loop circuits to receive and process the data transmitted over the buses.

It would be desirable to be able to provide integrated circuits such as programmable logic device integrated circuits with transceiver circuitry that handles source-synchronous transmissions while making efficient use of on-chip resources such as phase-locked-loop circuits.

SUMMARY

In accordance with the present invention, integrated circuits such as programmable logic device integrated circuits are provided with transceiver circuitry. The transceiver circuitry includes dynamic phase alignment circuits for use in processing received data signals from a remote transmitter.

The programmable logic devices can be used in a source synchronous architecture in which transmitting integrated circuits are clocked with a common clock. Each transmitting integrated circuit may transmit a clock signal and a set of associated data signals over a bus. The programmable logic device has associated transceiver circuits for receiving and processing data and clock signals for each bus.

A phase-locked-loop circuit uses a reference clock signal associated with a particular one of the buses to generate a multiphase dynamic phase alignment clock. The multiphase clock is distributed to the transceivers for each bus.

The transceivers use a master-slave architecture. A master dynamic phase alignment circuit in each bus receives the clock signal for that bus and receives the multiphase clock from the phase-locked-loop circuit. The master dynamic phase alignment circuit selects an optimal clock phase and produces a corresponding selected clock signal. The master dynamic phase alignment circuit in each bus distributes the selected clock signal for that bus to slave dynamic phase alignment circuits in that bus. Each slave circuit receives input data from a corresponding input line in the bus using the same selected clock.

Further features of the invention, its nature and various advantages will be more apparent from the accompanying drawings and the following detailed description of the preferred embodiments.

DETAILED DESCRIPTION

The present invention relates to integrated circuits containing programmable transceivers. The transceiver circuits contain hardwired circuitry and may contain programmable circuitry. The programmable circuitry in the transceiver is programmed to perform a custom transceiver function using configuration data. With one suitable arrangement, the transceiver is programmed by loading configuration data into volatile memory elements such as random-access-memory (RAM) cells.

The integrated circuits used with the present invention may be programmable logic device integrated circuits or programmable integrated circuits that contain programmable circuitry but that are not typically referred to as programmable logic devices. For example, the invention may be used with digital signal processing circuits containing programmable circuitry, microprocessors containing programmable circuitry, application specific integrated circuits containing programmable circuitry, or any other suitable integrated circuit. The present invention will generally be described in the context of programmable logic device integrated circuits and programmable logic device transceiver circuitry as an example.

Figure 1:
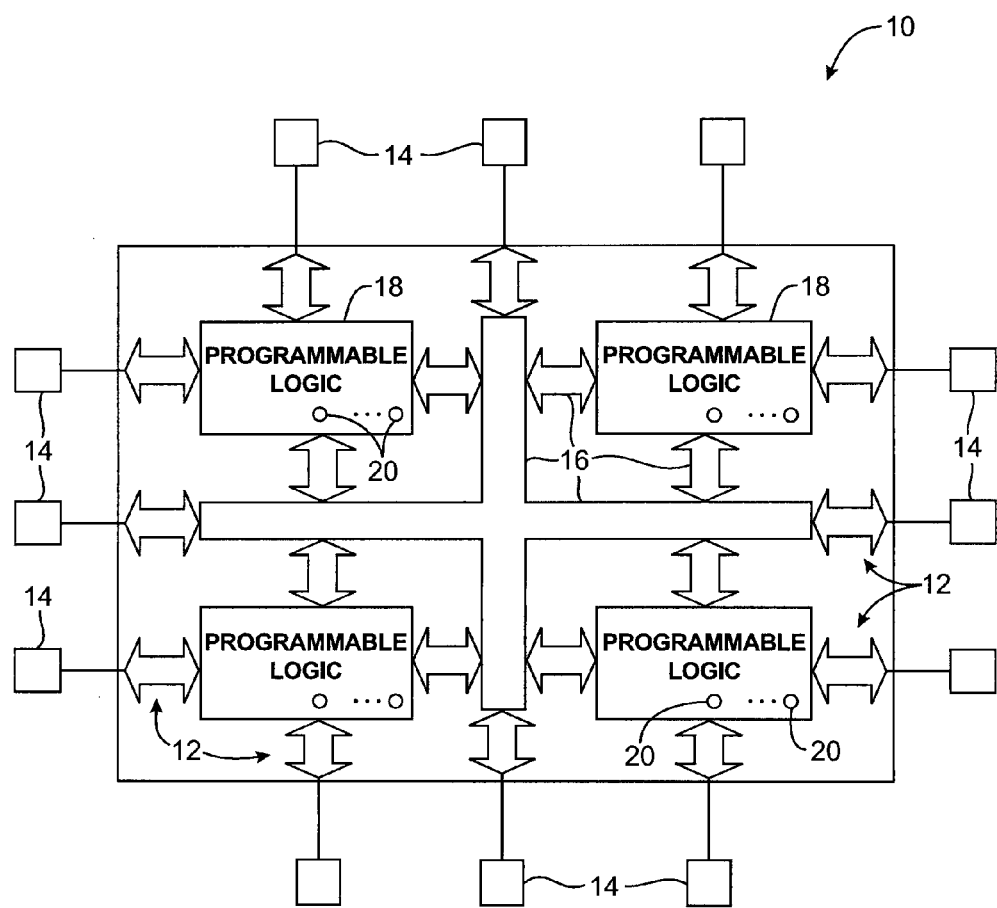
FIG. 1 is a diagram of an illustrative programmable logic device in accordance with the present invention.

An illustrative programmable logic device 10 in accordance with the present invention is shown in FIG. 1. Programmable logic device 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. For example, programmable logic 18 may include look-up tables, registers, and multiplexers. The programmable logic 18 may be configured to perform a custom logic function. The programmable interconnects associated with interconnection resources may be considered to be a part of programmable logic 18.

Programmable logic devices contain programmable elements 20. Some programmable logic devices are programmed by configuring their programmable elements 20 using mask programming arrangements. A mask-programmed device is configured during semiconductor manufacturing. Other programmable logic devices are configured after semiconductor fabrication operations have been completed (e.g., using electrical programming or laser programming to program their programmable elements). In general, programmable elements 20 may be based on any suitable programmable technology, such as fuses, antifuses, electrically-programmable read-only-memory technology, random-access memory cells, mask-programmed elements, etc.

Most programmable logic devices are electrically programmed. With electrical programming arrangements, the programmable elements 20 may be formed from memory cells. During programming, configuration data is loaded into the memory cells 20 using pins 14 and input/output circuitry 12. Most commonly, memory cells 20 are random-access-memory (RAM) cells. The use of memory cells 20 based on RAM technology is described herein as an example. Because the RAM cells are loaded with configuration data, they are sometimes referred to as configuration RAM cells (CRAM).

Memory cells 20 each provide a corresponding static control output signal that controls the state of an associated logic component in programmable logic 18. The output signals are typically applied to the gates of metal-oxide-semiconductor (MOS) transistors.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
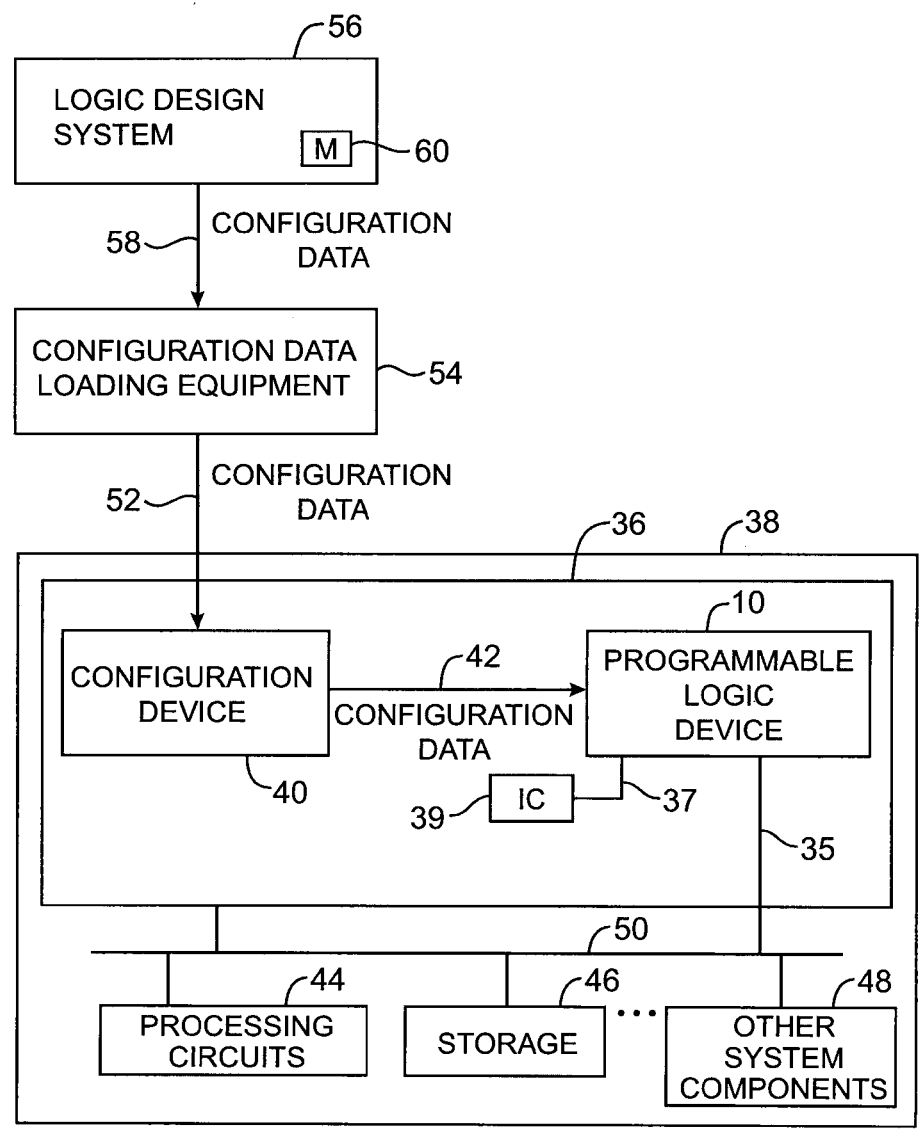
FIG. 2 is a diagram showing how programmable logic device configuration data is created by a logic design system and loaded into a programmable logic device to configure the device for operation in a system in accordance with the present invention.

An illustrative system environment for a programmable logic device 10 is shown in FIG. 2. Programmable logic device 10 may be mounted on a board 36 in a system 38. Programmable logic device 10 may receive configuration data from programming equipment or from any other suitable equipment or device. In the example of FIG. 2, programmable logic device 10 is the type of programmable logic device that receives configuration data from an associated integrated circuit 40. With this type of arrangement, circuit 40 may, if desired, be mounted on the same board 36 as programmable logic device 10. The circuit 40 may be an erasable-programmable read-only memory (EPROM) chip, a programmable logic device configuration data loading chip with built-in memory (sometimes referred to as a configuration device), or any other suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings. As shown in the example of FIG. 2, communications paths are used to interconnect device 10 to other components. For example, communications path 37 is used to convey data between an integrated circuit 39 that is mounted on board 36 and programmable logic device 10. Communications paths 35 and 50 are used to convey signals between programmable logic device 10 and components 44, 46, and 48.

Configuration device 40 may be supplied with the configuration data for device 10 over a path such as path 52. Configuration device 40 may, for example, receive the configuration data from configuration data loading equipment 54 or other suitable equipment that stores this data in configuration device 40. Device 40 may be loaded with data before or after installation on board 36.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 56 may be provided to equipment 54 over a path such as path 58. The equipment 54 provides the configuration data to device 40, so that device 40 can later provide this configuration data to the programmable logic device 10 over path 42. System 56 may be based on one or more computers and one or more software programs. In general, software and data may be stored on any computer-readable medium (storage) in system 56 and is shown schematically as storage 60 in FIG. 2.

In a typical scenario, logic design system 56 is used by a logic designer to create a custom circuit design. The system 56 produces corresponding configuration data which is provided to configuration device 40. Upon power-up, configuration device 40 and data loading circuitry on programmable logic device 10 is used to load the configuration data into the CRAM cells 20 of device 10. Device 10 may then be used in normal operation of system 38.

Figure 3:
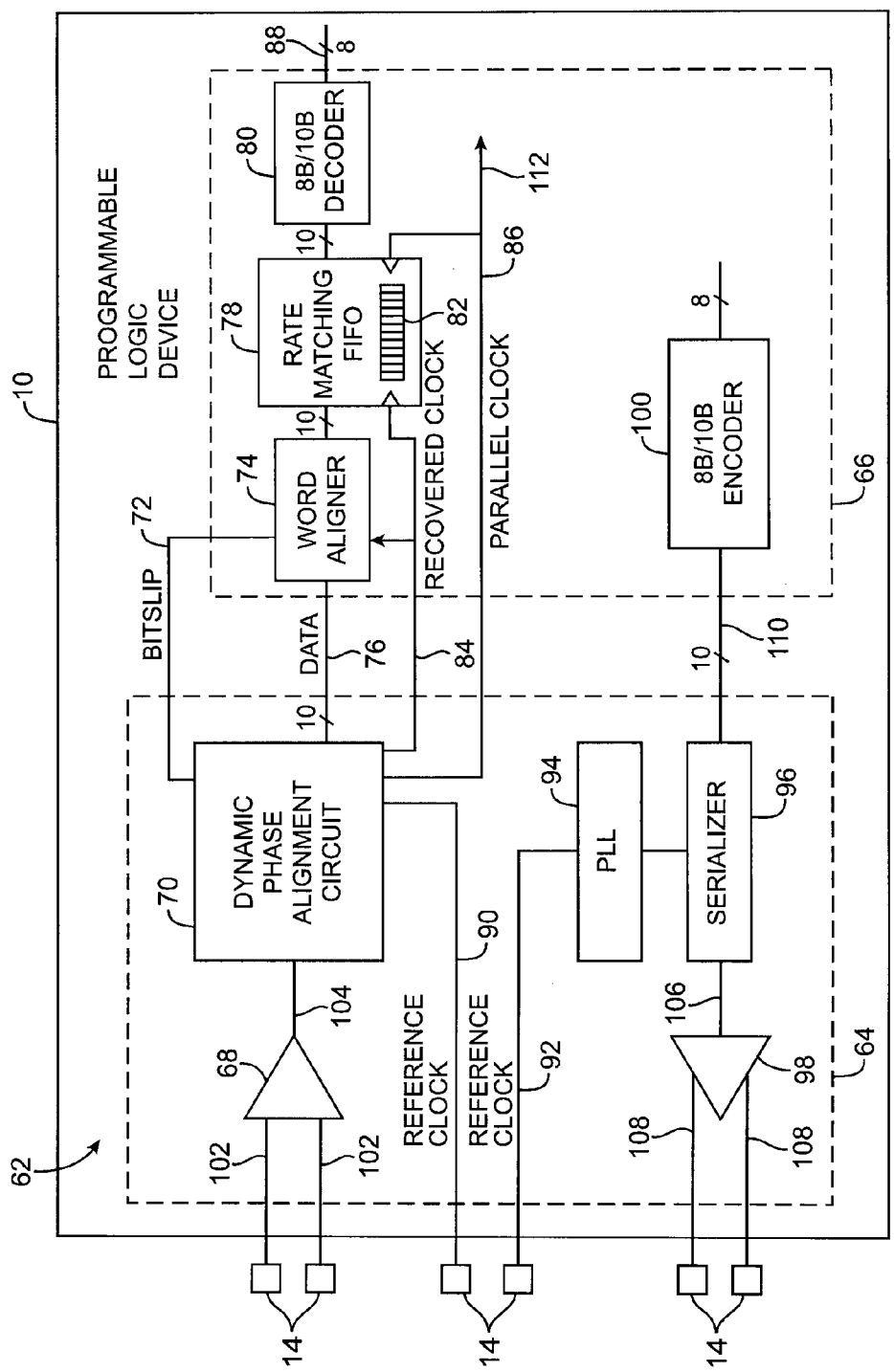
FIG. 3 is a diagram of illustrative programmable logic device integrated circuit transceiver circuitry in accordance with the present invention.

As shown in FIG. 3, programmable logic device 10 contains transceiver circuitry 62. Transceiver circuitry 62 handles high-speed serial data. In a typical scenario, there may be transceiver circuitry for tens or hundreds of different channels. The transceiver circuitry shown in FIG. 3 handles input data and output data for a single channel.

Transceiver 62 includes circuit 64 and circuit 66.

Circuit 64, which is sometimes referred to as a transceiver physical medium attachment layer, contains dedicated circuitry for handling high-speed signals. For example, circuit 64 includes high-speed analog circuitry such as input buffer 68 and output buffer 98. Input buffer 68 converts differential input signals received on inputs 102 into a single-ended signal on line 104. Output buffer 98 converts single-ended signals on line 106 into differential signals on lines 108. The differential signals on lines 102 and 108 are conveyed over differential signal paths such as paths 37, 35, and 50 of FIG. 2.

Circuit 64 also contains a hardwired dynamic phase alignment circuit 70 that processes the input data on line 104. Dynamic phase alignment circuit 70 receives a reference clock on line 90. The reference clock received on line 90 has a single phase. Dynamic phase alignment circuit 70 generates a multiphase clock signal based on the single-phase reference clock. The multiphase clock signal may, as an example, have sixteen separate phases. Because the multiphase clock is used by the dynamic phase alignment circuit 70, the multiphase clock is sometimes referred to as a dynamic phase alignment (DPA) clock. The DPA clock has a rate that is typically an integral multiple of the rate of the reference clock, so that the DPA clock is matched to the data rate of the input data on path 104. For example, the input data that is received may have a data rate of 1250 Mbps, whereas the reference clock may have a frequency of 125 MHz. In this scenario, the DPA alignment circuit produces a DPA clock that is ten times faster than the reference clock (i.e., a DPA clock running at 1250 MHz).

During processing of input data on line 104, the dynamic phase alignment circuit 70 determines which of the sixteen phases of the DPA clock signal produces optimum results when clocking in the input data 104. The dynamic phase alignment circuit 70 selects the optimum phase of the DPA clock and uses the selected phase to receive input data from line 104. After performing serial-to-parallel conversion, the dynamic phase alignment circuit 70 supplies the input data to circuit 66 on parallel data path 76. The dynamic phase alignment circuit 70 also supplies clock signals RECOVERED CLOCK and PARALLEL CLOCK to circuit 66.

Output data is handled using phase-locked loop circuit 94, serializer 96, and output buffer 98. Phase-locked loop circuit 94 receives a reference clock on path 92 and produces a corresponding clock for controlling serializer 96. Serializer 96 receives data from circuit 66. In a typical scenario, an 8B/10B encoder 100 that receives data from programmable logic on device 10 provides digital data to serializer 96 over ten parallel data lines 110. Serializer 96 converts this parallel data to a serial data stream on line 106. Output buffer 98 drives the single-ended serial data on line 106 onto differential data lines 108. The output data is then transmitted to a receiving integrated circuit.

Circuit 66, which is sometimes referred to as a soft physical coding sublayer, is preferably implemented from programmable logic 18. Because programmable logic resources are used in implementing the circuit 66, it is not necessary to dedicate hardware resources for circuit 66. In circuit designs that do not require the transceiver circuitry 66 in some or all I/O channels, programmable logic resources that would otherwise not be available are freed for use in implementing other circuitry.

Dynamic phase alignment circuit 70 contains a deserializer. The deserializer converts serial data on line 104 into parallel data on path 76 (e.g., parallel data on ten parallel lines). Dynamic phase alignment circuit 70 also contains a phase-locked-loop circuit that locks onto the reference clock. The phase-locked-loop circuit contains a clock multiplier that produces a multiphase DPA clock from the reference clock (e.g., a multiphase DPA clock at ten times the rate of the reference clock). The phase-locked-loop circuit also produces a slower clock (e.g., at the reference clock rate). The slower clock is used to process parallel data in device 10 and is therefore sometimes referred to as a parallel clock. The phase-locked-loop circuit also produces a serial clock that is phase-aligned with the parallel clock and that has the same rate as the DPA clock. A clock divider in the dynamic phase alignment circuit 70 divides the selected phase of the DPA clock to produce a slower clock signal that is sometimes referred to as the recovered clock.

The recovered clock is provided to word aligner 74 via path 84. Word aligner 74 monitors incoming data for a match with a known data pattern (e.g., idle characters in an 8B/10B encoding scheme). Word aligner 74 generates a control signal BITSLIP on line 72 that directs a data realigner circuit in circuit 70 to selectively drop incoming bits when needed to maintain word alignment in the input data. Word-aligned data is provided to rate matching first-in-first-out (FIFO) circuit 78.

Programmable logic 18 on device 10 processes data that is provided on path 88 after 8B/10B decoding by 8B/10B decoder 80. The programmable logic uses the parallel reference clock that is derived from the reference clock on line 90 by dynamic phase alignment circuit 70. The parallel reference clock is distributed to the programmable logic using paths such as path 86 and path 112.

Rate matching FIFO 78 contains a FIFO register formed from registers in programmable logic 18 (e.g., a bank of 20 registers that are connected together during device programming to form a 20-register-deep FIFO). The rate matching FIFO circuit 78 ensures that the incoming data that has been processed by dynamic phase alignment circuit 70 using the selected phase of the DPA clock is phase and rate matched to the programmable logic on device 10, which is using the parallel clock on path 86.

Rate matching FIFO circuit 78 contains an idle character generator for generating idle characters. Rate matching is accomplished by adding idle characters to the data stream from the idle character generator or by deleting idle characters as needed. Data is written into FIFO 78 using the recovered clock signal on path 84. Data is read out of FIFO 78 using the parallel clock 86. The phase-matched and rate-matched output data from rate matching FIFO 78 is provided to 8B/10B decoder 80 for decoding. If desired, encoding schemes such as 8B/10B decoding need not be used and decoder 80 and encoder 100 can be omitted.

Figure 4:
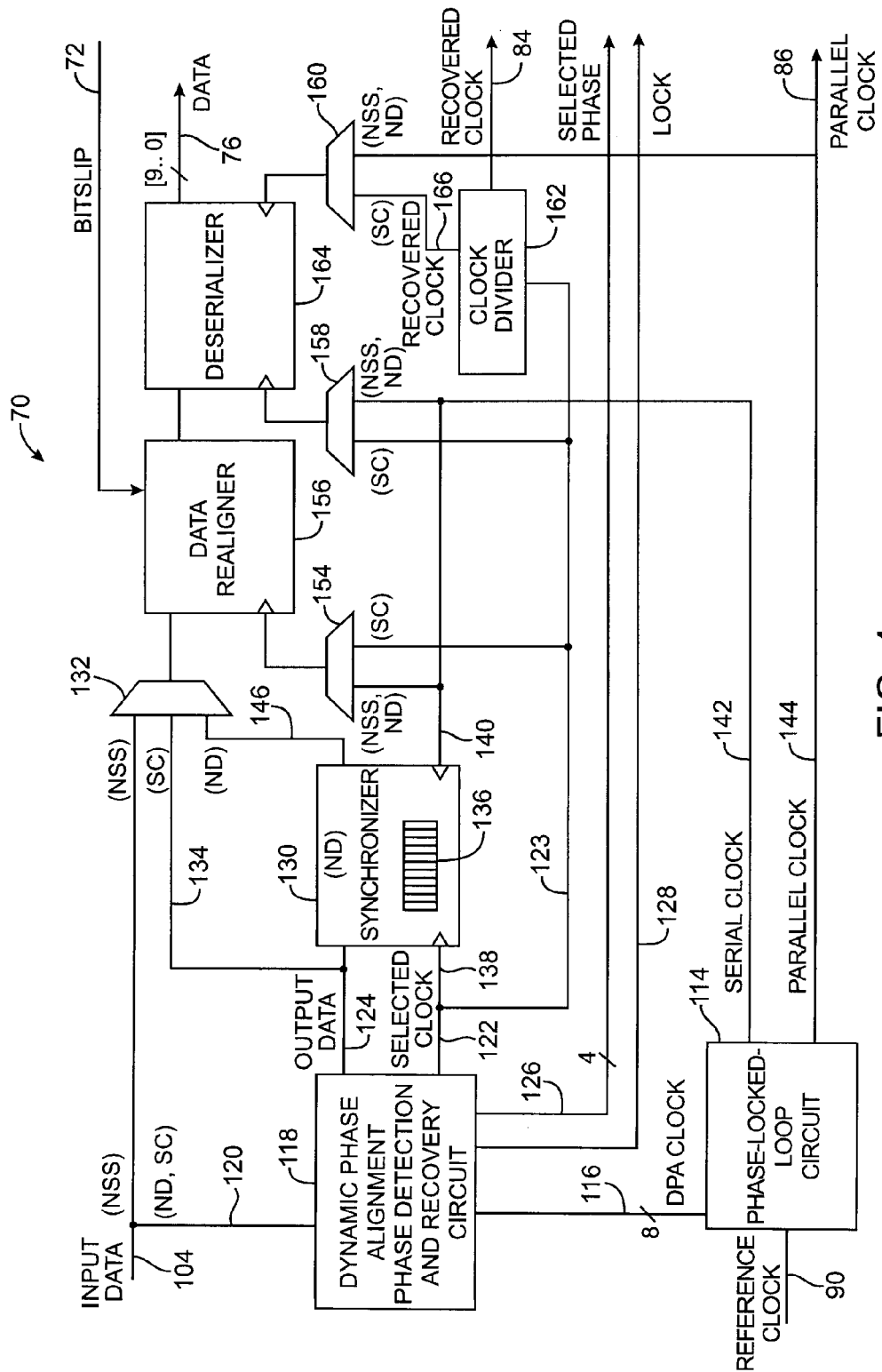
FIG. 4 is a diagram of an illustrative dynamic phase alignment circuit in an illustrative programmable logic device integrated circuit transceiver in accordance with the present invention.

An illustrative dynamic phase alignment circuit 70 that may be used in programmable logic device 10 of FIG. 3 is shown in FIG. 4. As shown in FIG. 4, dynamic phase alignment circuit 70 contains a phase-locked-loop circuit 114. Phase-locked-loop circuit 114 receives a reference clock on path 90 and generates a corresponding multiphase clock signal on path 116. The multiphase clock signal on path 116 generally has a frequency that is an integral multiple of the reference clock frequency, so that the multiphase clock signal matches the input data rate. For example, if the reference clock has a frequency of 125 MHz and the input data rate is 1250 Mbps, the multiphase clock may have a frequency of 1250 MHz. The multiphase clock signal on path 116 preferably has eight phases, each of which is shifted with respect to the other by one-eighth of a clock cycle. The eight-phase clock on path 116 is used for dynamic phase alignment and is therefore sometimes referred to as a dynamic phase alignment (DPA) clock.

The eight phases of the DPA clock are provided to dynamic phase alignment phase detection and recovery circuit 118. Circuit 118 preferably includes interpolation circuitry that converts the eight-phase DPA clock on line 116 into a more fine-grained sixteen-phase DPA clock. There are preferably numerous circuits 118 on programmable logic device 10 (e.g., there are circuits 118 for separate rows of logic array blocks). By localizing the generation of the sixteen-phase DPA clock within the circuits 118, the circuit real estate that is needed for path 116 is minimized, because only eight lines are needed in the path 116 instead of sixteen. If desired, a different number of phases may be generated in each circuit 18 (e.g., more than sixteen or fewer than sixteen).

The DPA phase detection and recovery circuit 118 receives input data from input 104 via path 120. Control circuitry in circuit 118 is used to determine which of the sixteen phases of the DPA clock signal produces optimum results when processing input data from input 104. The selected phase of the DPA clock is provided on output line 122 as the signal SELECTED CLOCK. The rising edge of the signal SELECTED CLOCK is aligned with the center of the input data pulses.

The DPA phase detection and recovery circuit 118 provides a LOCK signal on path 128 that indicates when the DPA phase detection and recovery circuit 118 has successfully identified the optimum phase of the sixteen-phase DPA clock to use in processing incoming data. The identity of the selected clock phase (e.g., number 13 out of 16) is provided using a four-bit SELECTED PHASE signal on line 126. The SELECTED PHASE signal may be used by user logic on device 10. DPA phase detection and recovery circuit 118 operates continuously as data is received by device 10. During operation, the selected phase of the DPA clock may be updated as needed. Because a sixteen-phase DPA clock is used, updates to the selected phase are less likely to result in data errors than if a less fine-grained DPA clock (e.g. an eight-phase clock) were used.

Figure 5:
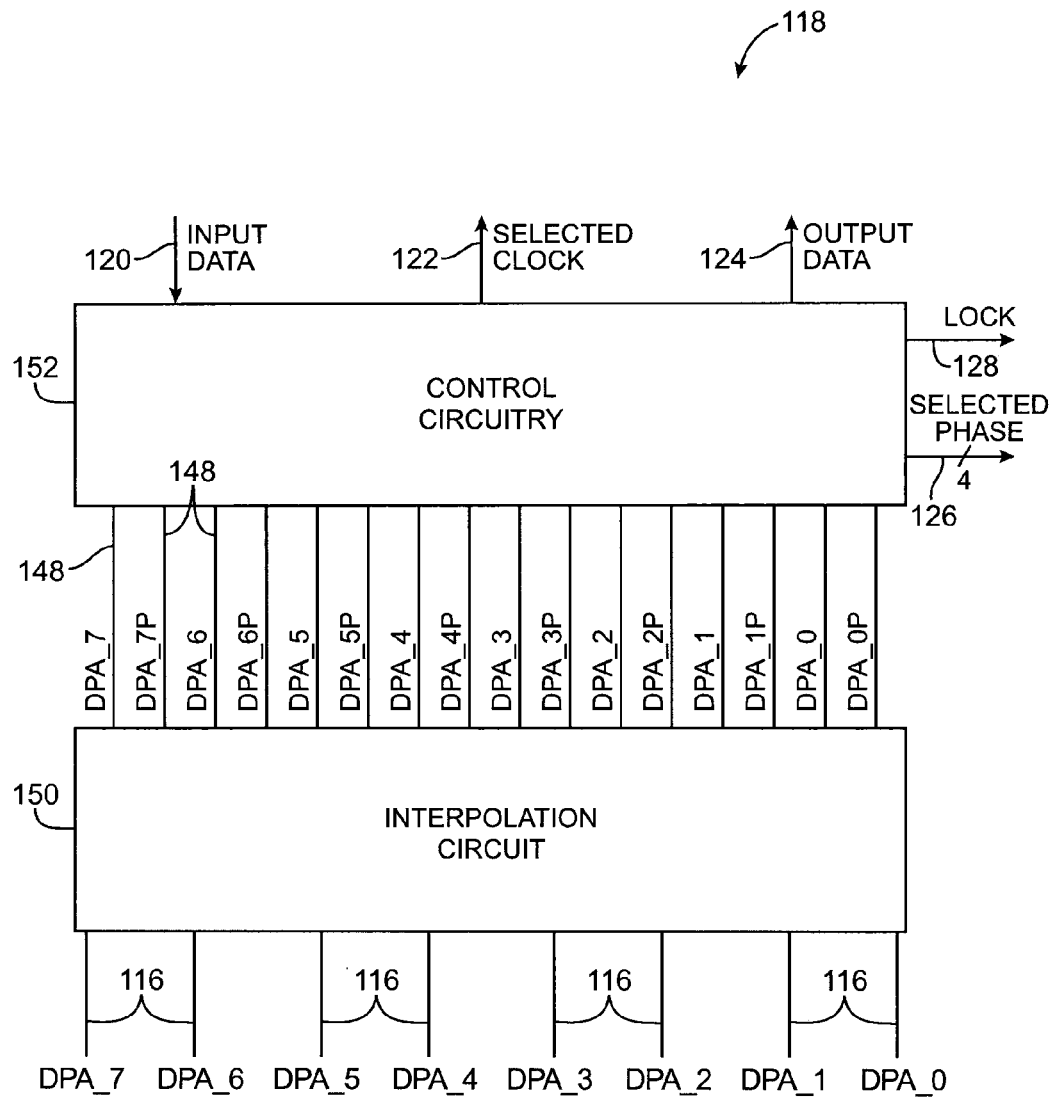
FIG. 5 is a circuit diagram of illustrative dynamic phase alignment phase detection and recovery circuitry of the type that may be used in the illustrative transceiver of FIG. 4 in accordance with the present invention.

An illustrative dynamic phase alignment phase detection and recovery circuit 118 is shown in FIG. 5. As shown in FIG. 5, eight phases of DPA clock are received by interpolation circuit 150 via input lines 116. Interpolation circuit 150 produces a corresponding sixteen-phase DPA clock signal on paths 148. Each of the sixteen phases of the DPA clock is shifted by one-sixteenth of a clock cycle with respect to the next. Control circuitry 152 receives input data on line 120 and selects the optimum phase of the DPA clock for processing this data. The optimum phase is provided as the SELECTED CLOCK signal on line 122 and has its leading edge aligned with the center of the input data pulses.

As shown in FIG. 4, data that has been received and processed by circuit 118 using SELECTED CLOCK is output on line 124 as output data. This output data can be routed to synchronizer 130 and, via path 134, to multiplexer 132.

Synchronizer 130 contains a hardwired first-in-first-out (FIFO) circuit 134 (e.g., a FIFO constructed from a hardwired set of eight registers). The synchronizer ensures that the output data from dynamic phase alignment phase detection and recovery circuit 118 that is received on path 124 is phase-aligned with the clock signals SERIAL CLOCK and PARALLEL CLOCK on lines 142 and 144.

The signal SERIAL CLOCK is produced by the phase-locked-loop circuit 114 based on the reference clock and may have the same rate as the DPA clock on path 116. The signal PARALLEL CLOCK is slower than the SERIAL CLOCK signal and is used for processing parallel data on device 10. In a typical scenario, the signal SERIAL CLOCK is an integer multiple of PARALLEL CLOCK (e.g., PARALLEL CLOCK may be one tenth of SERIAL CLOCK, one eight of SERIAL CLOCK, etc.). The signals SERIAL CLOCK AND PARALLEL CLOCK are phase aligned.

Data is written into the FIFO 136 in synchronizer 130 using the SELECTED CLOCK signal applied using path 138. Data is read from FIFO 136 using the SERIAL CLOCK signal applied using path 140. Data that has been phase aligned with the signal SERIAL CLOCK (and which is therefore phase aligned with PARALLEL CLOCK) is provided to multiplexer 132 via path 146.

Data from the output of multiplexer 132 is provided to data realigner 156. Data realigner 156 receives a control signal BITSLIP from word aligner 74 (FIG. 3). When needed to maintain word alignment in the input data stream, word aligner 74 drops data bits (e.g., idle character bits) from the input data.

Deserializer 164 performs serial-to-parallel data conversion on the data received from data realigner 156. The amount of serial-to-parallel conversion that is produced is preferably adjustable (i.e., deserializer 164 is a 1:N deserializer where valid deserialized data is output on N of the output lines 76). Clock divider 162 is used to divide the signal SELECTED CLOCK by an appropriate integer (e.g., 2, 4, 5, 6, 8, or 10). For example, if deserializer 164 produces N parallel data signals on output lines 156, clock divider 162 may divide the signal SELECTED CLOCK by N to produce the signal RECOVERED CLOCK on lines 84 and 166.

Multiplexers 132, 154, 158, and 160 are adjusted to configure the circuit 70 for proper operation in one of several modes of operation. Circuitry such as multiplexers 132, 154, 158, and 160, clock divider 162, deserializer 164, and phase-locked-loop 114 (which contains an adjustable clock multiplier) can be controlled by static control signals at the outputs of suitable configuration random-access-memory cells 20 or can be controlled by dynamic control signals (e.g., dynamic control signals from external pins or received from core logic in the programmable logic 18 of device 10). By adjusting the circuitry of FIG. 4 and by selectively implementing the circuitry 66 of FIG. 3 from programmable logic resources available on the programmable logic device 10, a user can operate the transceiver 62 in a desired mode of operation.

Figure 6:
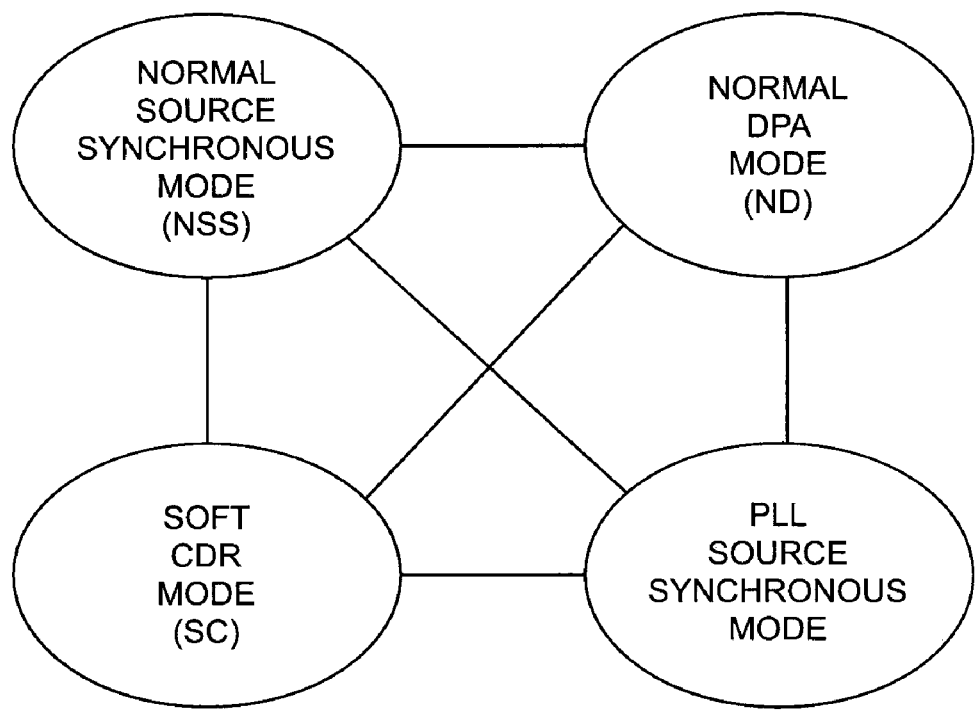
FIG. 6 is a state diagram showing illustrative modes of operation for the transceiver circuitry in accordance with the present invention.
Figure 9:
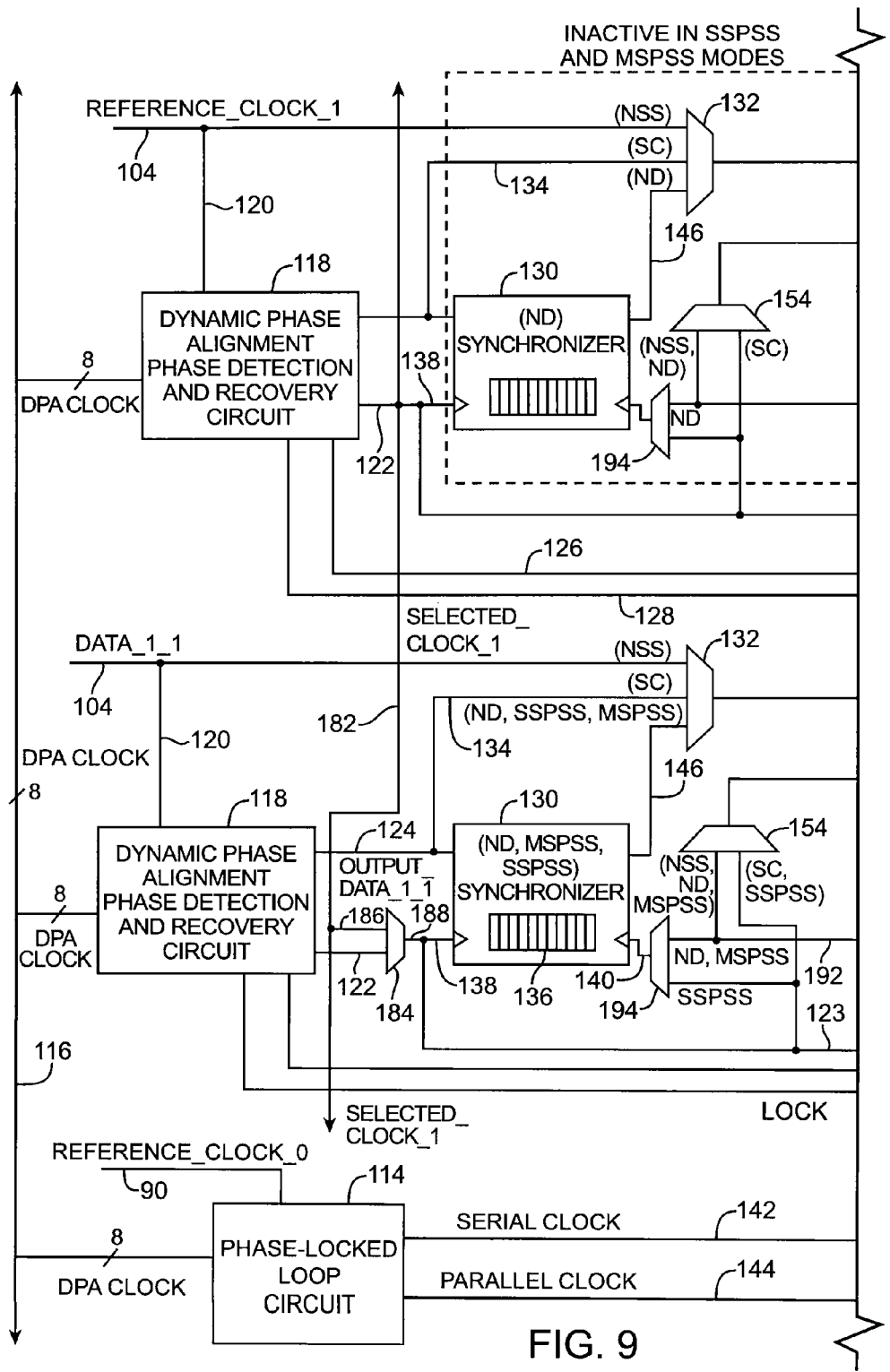
FIG. 9 is a diagram showing two illustrative dynamic phase alignment circuits from one of the transceivers of FIG. 8 in accordance with the present invention.
Figure 9:
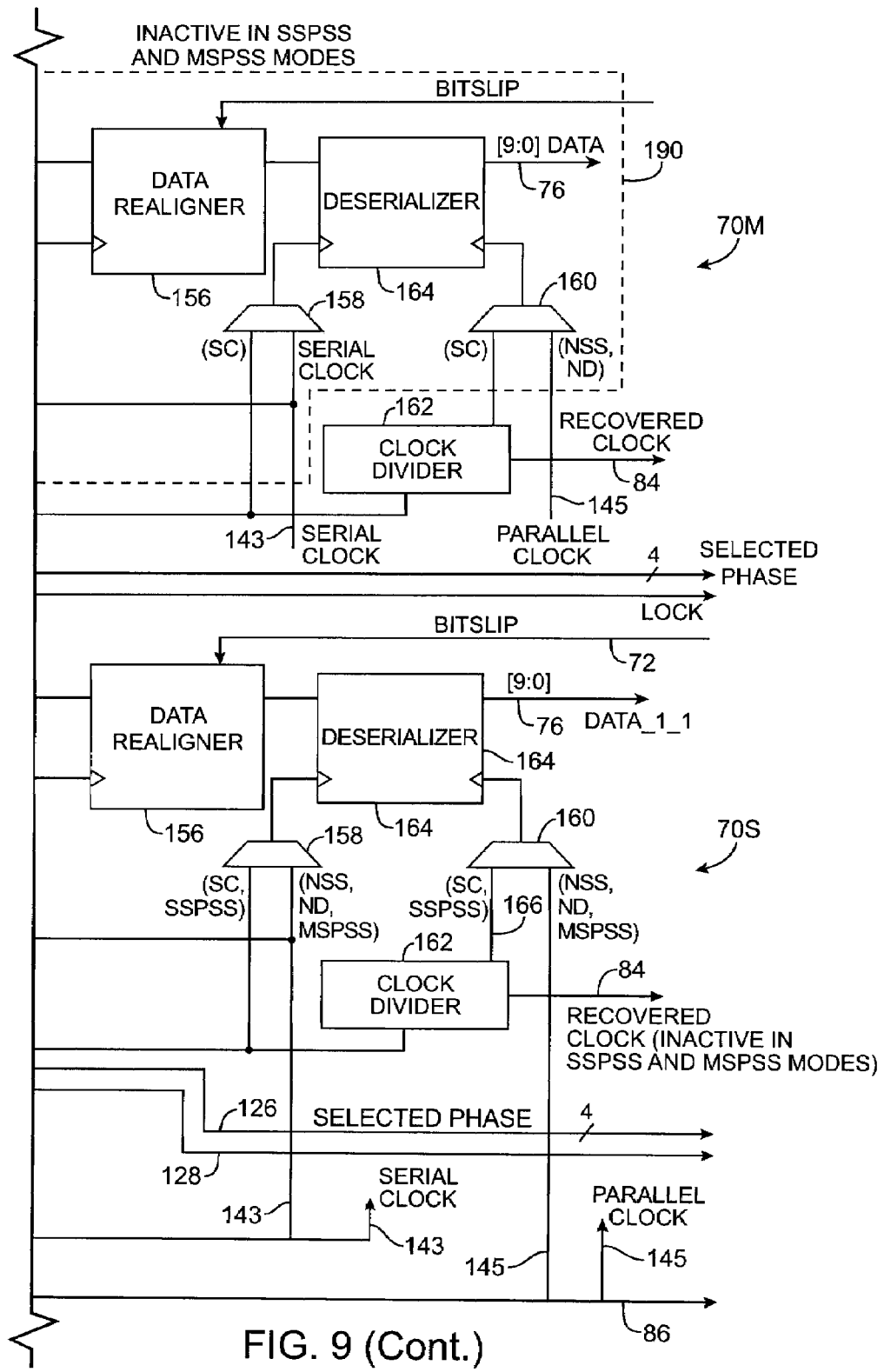

The modes of operation supported by DPA circuit 70 are shown in the state diagram of FIG. 6. The modes are: normal source synchronous mode (NSS), normal dynamic phase alignment mode (ND), soft clock data recovery mode (SC), and phase-locked-loop source synchronous mode. The phase-locked-loop source synchronous mode includes two sub-modes—slave synchronous phase-locked-loop source synchronous (SSPSS) and master synchronous phase-lockedloop source synchronous (MSPSS). Paths in the diagram of FIG. 4 and FIG. 9 are labeled "NSS," "ND," "SC," "SSPSS," and "MSPSS" as appropriate to show which paths are active in each mode.

In normal source synchronous (NSS) mode, there is no rate matching or phase alignment performed by the transceiver 62. This is because in source synchronous mode the reference clock on device 10, which is serving as a receiver clock, is exactly matched to the clock on the transmitting integrated circuit. This situation may arise, for example, when a single oscillator crystal is used to clock both the transmitting integrated circuit and the receiving integrated circuit. Because there is no mismatch between the transmitting and receiving clocks, there is no need for synchronizer 130. Synchronizer 130 is therefore bypassed by routing data from input 104 through the NSS input of multiplexer 132, as shown in FIG. 4. Multiplexer 154 is used to route the signal SERIAL CLOCK to the clock input of data realigner 156. Multiplexer 158 is used to route the SERIAL CLOCK signal to the serial clock input of deserializer 164. The signal REFERENCE CLOCK is forwarded on lines 114 and 86 by phase-locked-loop circuit 114 as the signal PARALLEL CLOCK (sometimes referred to as the forwarded clock). The forwarded clock may be used by downstream user logic on device 10. Multiplexer 160 is used to route the signal PARALLEL CLOCK to the parallel clock input of deserializer 164. Deserializer 164 performs serial-to-parallel conversion on the data received from data realigner 156 and provides parallel output data to circuit 66 (FIG. 3) via path 76.

In normal dynamic phase alignment mode (ND), there is no rate difference between the transmitter clock and the receiver clock, as with the normal source synchronous situation. However, in normal dynamic phase alignment mode, the transceiver 62 uses synchronizer 130 to perform phase alignment. During the dynamic phase alignment mode, input data is received by dynamic phase alignment phase detection and recovery circuit 118 via path 120. The DPA clock is provided to circuit 118 via path 116. Circuit 118 selects the optimal DPA clock phase and provides the selected clock signal SELECTED CLOCK to synchronizer 130 via path 138. The signal SELECTED CLOCK is used to receive the input data into circuit 118. Corresponding output data is provided to synchronizer 130 via path 124. The phase-aligned output data from the synchronizer output is provided to data realigner 156 via path 146 and multiplexer 132. Multiplexer 154 is used to route the signal SERIAL CLOCK to the clock input of data realigner 156. Multiplexer 158 is used to route the SERIAL CLOCK signal to the serial clock input of deserializer 164. The signal REFERENCE CLOCK is forwarded on lines 114 and 86 by phase-locked-loop circuit 114 as the signal PARALLEL CLOCK. The forwarded PARALLEL CLOCK signal may be uses by user-defined programmable logic (user logic). Multiplexer 160 is used to route the signal PARALLEL CLOCK to the parallel clock input of deserializer 164. Deserializer 164 performs serial-to-parallel conversion on the data received from data realigner 156 and provides corresponding parallel data on output 76.

In soft clock data recovery mode (SC), the transmitter clock and the receiver clock may have slightly different rates. This discrepancy may arise, for example, because the transmitter clock and the receiver clock are derived from different oscillating crystals (e.g., oscillators on different boards in a system). Because the clock rates at the transmitter and receiver are not exactly the same, the programmable logic 18 in device 10 is configured to implement the rate matching FIFO 78 of circuit 66 (FIG. 3). The rate matching FIFO 78 is used to perform both phase-alignment and rate matching operations. Because phase alignment is handled by rate matching FIFO 78, it is not necessary to perform phase alignment using synchronizer 130 of FIG. 4. Accordingly, synchronizer 130 is bypassed.

During soft clock data recovery mode, input data is received by circuit 118 via path 120. Phase-locked-loop circuit 114 receives a reference clock signal on path 90 and generates a corresponding multiphase DPA clock on path 116. Dynamic phase alignment phase detection and recovery circuit 118 receives the DPA clock and selects the optimal phase for receiving the input data on path 120. The selected phase is output as signal SELECTED CLOCK on line 122. The processed output data is provided on path 124. Multiplexer 132 is configured to route the output data on path 124 to the input of data realigner 156. The SELECTED CLOCK signal is passed to the clock input of data realigner 156 via multiplexer 154. Clock divider 162 divides the signal SERIAL CLOCK to produce the signal RECOVERED CLOCK on lines 84 and 166. Multiplexer 160 is configured to route the clock output from clock divider 162 to the parallel clock input of deserializer 164. The signal SELECTED CLOCK is routed to the serial clock input of deserializer 164 via multiplexer 158. Serializer 164 provides parallel data corresponding to the serial data received from data realigner 156 to circuit 66 (FIG. 3) via path 76. The PARALLEL CLOCK signal on path 86 and the RECOVERED CLOCK signal on path 84 are provided to FIFO 78 (FIG. 3).

During slave synchronous phase-locked-loop source synchronous mode (SSPSS) and master synchronous phase-locked-loop source synchronous mode (MSPSS), five transceivers are grouped together. The five transceivers receive data over a bus that contains four differential data signals and one differential clock signal. One transceiver serves as a master and the other four transceivers serve as slaves. If desired, different numbers of transceivers may be grouped together. A group of five transceivers is described as an example.

The master transceiver contains a master DPA circuit 70 that receives the differential clock signal from the bus. The master DPA circuit 70 uses the clock signal to select an optimum DPA clock phase to receive the data signals from the bus. The optimum DPA clock phase is distributed from the master DPA circuit to the slave DPA circuits as the signal SELECTED CLOCK. Each slave circuit uses the distributed value of SELECTED CLOCK to write data to its synchronizer.

In a slave DPA circuit 70, the DPA clock is provided to dynamic phase alignment detection and recovery circuit 118 via path 116. The signal SELECTED CLOCK is conveyed to path 138 from the master DPA circuit 70. A multiplexer (not shown in FIG. 4) is used to route the SELECTED CLOCK signal from the master DPA circuit onto paths 138 and 123. Circuit 118 receives input data on path 120 and provides corresponding output data on path 124. The signal SELECTED CLOCK from the master DPA circuit 70 is provided to synchronizer 130 via path 138 and is used to write data into FIFO 136. The read clock used to read data from synchronizer 130 is selected using a multiplexer (not shown in FIG. 4). In slave synchronous phase-locked-loop source synchronous mode (SSPSS), the SELECTED CLOCK signal is used to read data from synchronizer 130. In master synchronous phase-locked-loop source synchronous mode (MSPSS), the signal SERIAL CLOCK is used to read data from synchronizer 130. Multiplexers 132, 154, 158, and 160 are configured to route the clock and data signals to the data output 76 and clock output of circuit 70.

In master synchronous phase-locked-loop source synchronous mode, the read clock for the synchronizer 130 is SERIAL CLOCK and the read clock for deserializer 164 is PARALLEL CLOCK, so conversion from the SELECTED CLOCK to PARALLEL CLOCK clock domain is handled in the dynamic phase alignment circuit 70. In slave synchronous phase-locked-loop source synchronous mode (SSPSS), a logic designer implements a recovered-clock-to-parallel-clock phase compensation first-in-first-out (FIFO) circuit in circuit 66 (FIG. 3). This circuit converts the data from the RECOVERED CLOCK clock domain to the PARALLEL CLOCK clock domain.

Figure 7:
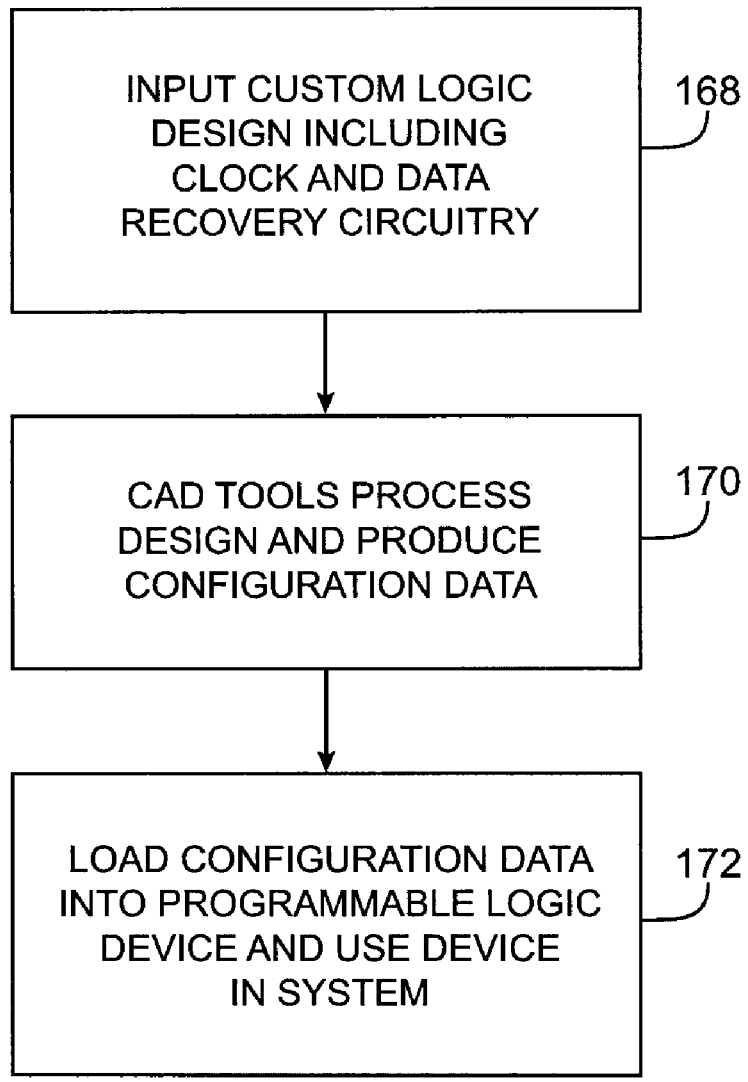
FIG. 7 is a flow chart of illustrative steps involved in programming and using a programmable logic device integrated circuit with transceiver circuitry in accordance with the present invention.

Illustrative steps involved in configuring and using a programmable logic device 10 with transceiver circuitry of the type shown in FIGS. 3 and 4 are shown in FIG. 7.

At step 168, a user (e.g., a logic designer) creates a custom logic design for a programmable logic device 10 using logic design system 56 (FIG. 2). During the design process, the user decides whether or not some or all of the transceivers 62 on the programmable logic device 10 will need clock and data recovery features such as rate matching. If clock rate matching functionality is needed to support system design constraints, the logic design that is created at step 168 includes a design for circuitry such as the circuit 66 of FIG. 3. For example, the circuit design that is created includes a rate matching FIFO 78. If desired, various designs for circuit 66 may be maintained in a design library. The logic designer can create the design by copying all or part of the design for circuit 66 from the library. The logic designer also decides whether or not some or all of the transceivers 62 on device 10 will be operated in slave synchronous phase-locked-loop source synchronous mode. If it is desired to support clock compensation operations in slave synchronous phase-locked-loop source synchronous mode (SSPSS), the logic designer may implement a recovered clock to parallel clock phase compensation first-in-first-out (FIFO) circuit in circuit 66 (FIG. 3). This circuit converts the data from the RECOVERED CLOCK clock domain to the PARALLEL CLOCK clock domain when circuit 70 is operated in slave synchronous phase-locked-loop source synchronous mode.

At step 170, the computer-aided-design (CAD) tools on logic design system 56 process the user's design and produce corresponding configuration data.

At step 172, the configuration data is loaded into a programmable logic device and the programmable logic device is used in a system, as described in connection with FIG. 2. During operation in a system, the configuration data (or dynamic control signals from programmable logic 18 on the device 10) configures the adjustable circuitry in transceiver 62 so that the transceiver operates in its desired mode (i.e., normal source synchronous mode, normal dynamic phase alignment mode, soft clock data recovery mode, slave synchronous phase-locked-loop synchronous mode, or master synchronous phase-locked-loop source synchronous mode).

Figure 8:
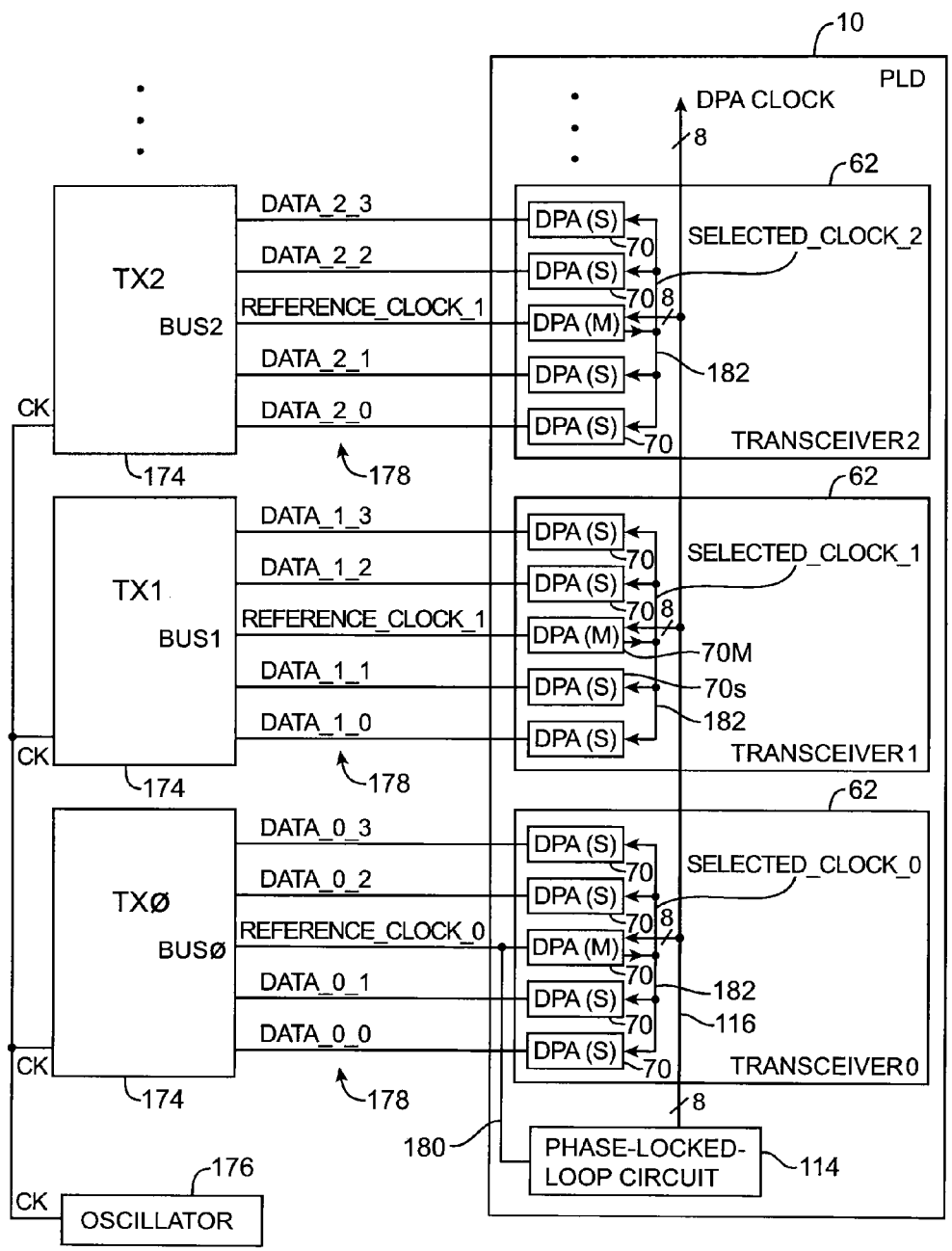
FIG. 8 is a diagram showing a system in which a programmable logic device integrated circuit uses transceiver circuitry operating in phase-locked-loop source synchronous mode in accordance with the present invention.

In some system environments, programmable logic device 10 and transceiver circuits 62 are operated in slave synchronous phase-locked-loop source synchronous mode (SSPSS) or master synchronous phase-locked-loop source synchronous mode (MSPSS). An illustrative system environment of this type is shown in FIG. 8. As shown in FIG. 8, a number of transmitting integrated circuits 174 (transmitters) are provided with a common clock signal CK. The circuits 174 may be, for example, individual integrated circuits mounted on a common circuit board. The common clock signal CK may be generated by a single oscillator 176 mounted on the circuit board.

The transmitters transmit data to programmable logic device 10 over a number of buses 178 (bus0, bus1, bus2, etc.). The buses may each be associated with a separate data communications channel. Each bus (in this example) contains five differential signal paths, each of which contains a pair of conductors (e.g., a pair of traces on a circuit board). Four of the five paths in each bus are data paths and one of the five paths in each bus is a clock path. For example, bus1 caries the four data signals DATA_1_0, DATA_1_1, DATA_1_2, and DATA_1_3. The clock signal for bus1 is REFERENCE_CLOCK_1. The signal REFERENCE_CLOCK_1 may have a frequency of 400 MHz and the DATA signals may each have data rates of 400 Mbps (as an example).

Unavoidable variations in the electrical properties of the bus paths give rise to signal skew. For example, the signal DATA_1_0 might lag the signal REFERENCE_CLOCK_1 by 0.1 clock cycles and the signal DATA_1_3 might lead the signal REFERENCE_CLOCK_1 by 0.15 clock cycles.

With the arrangement shown in FIG. 8, the signals on the buses 178 are received by respective groups of DPA circuits 70. Because there are five paths in each bus 178 in this example, there are five associated DPA circuits 70 in each transceiver block 62.

In the slave synchronous and master synchronous phase-locked-loop source synchronous modes, one of the DPA circuits 70 in each block 62 serves as a master while the other four DPA circuits in that block serve as slaves. The DPA circuits 70 in FIG. 8 are labeled "M" for master and "S" for slave, accordingly.

Resources can be conserved by using a single phase-locked-loop circuit to service numerous transceivers 62 and dynamic phase alignment circuits 70. There may be, for example, about 40 transceivers 62 on a single device 10, all of which share the same phase-locked-loop circuit 114. Phase-locked loops tend to consume relatively large amounts of circuit real estate, so sharing phase-locked loop circuit 114 conserves circuit resources.

Phase-locked-loop circuit 114 is provided with one of the reference clocks via clock path 180. In the example of FIG. 8, the phase-locked-loop circuit 114 is provided with the clock signal REFERENCE_CLOCK_0. The phase-locked-loop circuit 114 generates a corresponding eight-phase DPA clock from the signal REFERENCE_CLOCK_0 and distributes the eight-phase DPA clock to the master DPA circuits 70 in each transceiver. A DPA clock distribution bus 116, which is sometimes referred to as a DPA clock tree, is used to distribute the DPA clock.

Each master DPA circuit 70 receives the eight-phase DPA clock and uses its interpolation circuit 150 to generate sixteen corresponding DPA clock phases. Each master DPA circuit also receives a REFERENCE CLOCK signal for its bus. The master DPA uses the REFERENCE CLOCK signal to select an optimum one of the sixteen DPA clock phases (i.e., a DPA clock phase that is shifted 90° out-of-phase with respect to the REFERENCE CLOCK). This optimum DPA clock phase is output as the signal SELECTED CLOCK on a local selected clock distribution path 182. There is a separate distribution path 182 associated with each group of five DPA circuits (i.e., for each data communications channel and transceiver 62).

For example, in the communications channel for bus1, the master DPA circuit (labeled 70M) produces a SELECTED_CLOCK_1 signal that is distributed to all of the slave DPA circuits over a path 182. The slave DPA circuit that handles the signal DATA_1_1 is labeled 70S in FIG. 8.

The circuitry of master DPA circuit 70M and slave DPA circuit 70S is shown in more detail in FIG. 9. As shown in FIG. 9, master DPA circuit 70M and slave DPA circuit 70S contain dynamic phase alignment phase detection and recovery circuits 118 and the other circuitry described in connection with FIG. 4.

The input line 104 in master DPA circuit 70M receives the clock signal REFERENCE_CLOCK_1. This signal is conveyed to the dynamic phase alignment phase detection and recovery circuit 118 via path 120. Circuit 118 in master DPA circuit 70M receives the eight-phase DPA clock signal over DPA clock bus 116. Circuit 118 contains an interpolation circuit 150, as described in connection with FIG. 5. The interpolation circuit 150 generates sixteen phases of DPA clock from the eight-phase DPA clock received over path 116. The dynamic phase alignment phase detection and recovery circuit 118 compares the signal REFERENCE_CLOCK_1 to the sixteen DPA clock phases and selects an optimum clock phase to use in clocking in the data on bus1. The optimal DPA clock phase for bus1 is called SELECTED_CLOCK_1. The optimum clock phase is 90° out of phase with the leading edge of the REFERENCE_CLOCK_1 signal. This places the leading edge of SELECTED_CLOCK_1 in the nominal midpoint of the data pulses being received on the associated data lines of bus1.

Due to skew, the data on each bus line is slightly skewed with respect to SELECTED_CLOCK_1. Nevertheless, by maintaining tight bus tolerances in the system, the data signal on each data line in bus1 is assured of being close to SELECTED_CLOCK_1 (e.g., within about 0.2 or 0.1 of a clock cycle).

Once the circuit 118 in the master DPA circuit has identified SELECTED_CLOCK_1 as the optimum phase of the DPA clock to use for receiving the bus1 data, the master DPA circuit 70M distributes this signal to the slave DPA circuits 70 in bus1 such as slave DPA circuit 70S. As shown in FIG. 9, a selected clock distribution path 182 is used to distribute the SELECTED_CLOCK_1 signal.

Each slave DPA circuit 70 receives a corresponding data signal. As shown in FIG. 9, the dynamic phase alignment detection and recovery circuit 118 in DPA circuit 70S receives signal DATA_1_1 on line 120. This data is output as a corresponding signal OUTPUT_DATA_1_1 on path 124 for writing into synchronizer 130.

Each slave DPA circuit 70 has a multiplexer 184 that is used to choose an appropriate clock signal. During normal source synchronous mode (NSS), the output of multiplexer 184 is not used. During normal dynamic phase alignment mode (ND), multiplexer 184 is configured so that the input 122 of multiplexer 184 is connected to output 188. This allows the selected DPA phase from circuit 118 to be used to write data into its associated synchronizer 130, as described in connection with FIG. 4. In soft clock data recovery mode, input 122 is connected to output 188, so that the selected DPA phase can be applied to the data realigner via multiplexer 154, can be applied to the serial clock input of deserializer 164 via multiplexer 158, and can be applied to the parallel clock input of deserializer 164 via clock divider 162 and multiplexer 160.

During slave synchronous phase-locked-loop source synchronous mode and master synchronous phase-locked-loop source synchronous mode, multiplexer 184 is configured so that input 186 is connected to output 188. In this configuration, each of the slave DPA circuits 70 such as slave DPA circuit 70S routes the optimal DPA phase (SELECTED_CLOCK_1 in the present example) onto paths 138 and 123.

As shown in FIG. 8, a single phase-locked-loop circuit 114 may be shared among multiple transceivers 62, buses, and master DPA circuits 70. As shown in FIG. 9, phase-locked-loop circuit 114 receives the signal REFERENCE_CLOCK_0 on an input line 90 and generates the corresponding clock signal outputs DPA CLOCK on path 116, SERIAL CLOCK on path 142, and PARALLEL CLOCK on path 144. The signal SERIAL CLOCK is distributed to the inputs of the multiplexers 154, 158, 190 in each of the DPA circuits via paths 143 and 190. The signal PARALLEL CLOCK is distributed to the inputs of the multiplexers 160 in each of the DPA circuits via paths 145.

During slave synchronous phase-locked-loop source synchronous mode (SSPSS) and master synchronous phase-locked-loop source synchronous (MSPSS) modes, the circuitry in block 190 of the master DPA circuit 70M is inactive.

In slave synchronous phase-locked-loop source synchronous mode, clock divider 162 in circuit 70M receives the signal SELECTED_CLOCK_1 and generates a corresponding signal RECOVERED CLOCK on line 84. In the slave circuits such as slave circuit 70S, the recovered clock output 84 of the clock divider 162 is inactivated (e.g., using a configuration bit). The clock divider 162 in each of the slave circuits in bus1 receives the signal SELECTED_CLOCK_1 and uses this signal to generate a corresponding recovered clock signal on its output 166. The clock dividers 162 that are associated with the other buses receive corresponding optimal DPA clock phase signals. In each bus, the master circuit 118 selects the optimal DPA clock phase, so in general, each bus has a different value of SELECTED CLOCK.

In slave synchronous phase-locked-loop source synchronous mode, multiplexer 194 is configured to route the signal SELECTED_CLOCK_1 to the read clock input 140 of synchronizer 130. Multiplexer 154 is used to route the signal SELECTED_CLOCK_1 to the clock input of data realigner 156. Multiplexer 158 is used to route the SELECTED_CLOCK_1 signal to the serial clock input of deserializer 164. Data realigner 156 receives data from synchronizer 130 via multiplexer 132. Deserializer 164 performs serial-to-parallel conversion on the data received from data realigner 156 and provides corresponding parallel data on output 76. Circuit 66 receives the parallel data on output 76. Multiplexer 160 is used to route the signal RECOVERED CLOCK on line 166 to the parallel clock input of deserializer 164. The signal RECOVERED CLOCK is derived from SELECTED_CLOCK_1, so with the slave synchronous phase-locked-loop source synchronous scheme, the data that is transmitted on data path 76 to circuit 66 is in the SELECTED CLOCK (RECOVERED CLOCK) domain. The user can implement a FIFO-based clock conversion circuit in circuit 66 from programmable logic that converts the data from the SELECTED CLOCK (RECOVERED CLOCK) domain to the PARALLEL CLOCK domain.

In master synchronous phase-locked-loop source synchronous mode, multiplexer 194 is configured to route the signal SERIAL CLOCK to the read clock input 140 of synchronizer 130 from path 192. Multiplexer 154 is used to route the signal SERIAL CLOCK to the clock input of data realigner 156. Multiplexer 158 is used to route the SERIAL CLOCK signal to the serial clock input of deserializer 164. Data realigner 156 receives data from synchronizer 130 via multiplexer 132. Deserializer 164 performs serial-to-parallel conversion on the data received from data realigner 156 and provides corresponding parallel data on output 76. Circuit 66 receives the parallel data on output 76. Multiplexer 160 is used to route the signal PARALLEL CLOCK from paths 144 and 145 to the parallel clock input of deserializer 164.

With the master synchronous phase-locked-loop source synchronous scheme, the read clock for synchronizer 130, the clock for data realigner 156, and the serial clock for deserializer 164 are provided using the signal SERIAL CLOCK and the parallel clock for deserializer 164 is provided using the signal PARALLEL CLOCK. The conversion of the input data to the PARALLEL CLOCK domain is performed in the dynamic phase alignment circuit 70, so there is no need for user logic to implement a FIFO clock conversion circuit.

In the master synchronous phase-locked-loop source synchronous and the slave synchronous phase-locked-loop source synchronous modes, the buses of FIG. 8 have relatively low skew. With one illustrative arrangement, the maximum permitted variation in clock phase between any two signals in a bus is maintained below 0.2 or 0.1 clock cycles. The use of the common clock signal SELECTED CLOCK to write input data (e.g., DATA_1_0, DATA_1_1, DATA_1_2, and DATA_1_3) in each bus through corresponding synchronizers 130 aligns the phases of the data in each bus. Each bus uses a different optimal clock phase SELECTED CLOCK to receive the input data and to write that data to a corresponding synchronizer 130, but because a master DPA circuit in each bus is used to derive the optimal signal SELECTED CLOCK for that bus, only a single phase-locked-loop and a single set of DPA CLOCK signals is required to service many (e.g., 20-40) buses.

The foregoing is merely illustrative of the principles of this invention and various modifications can be made by those skilled in the art without departing from the scope and spirit of the invention.

What is claimed is:

1. An integrated circuit, comprising:
   a phase-locked-loop circuit that provides a multiphase dynamic phase alignment clock; and
   a plurality of transceivers, each receiving an associated reference clock signal and multiple associated data signals over a respective bus and each comprising:
      a master dynamic phase alignment circuit that uses the reference clock associated with the transceiver to select a clock phase of the multiphase dynamic phase alignment clock for the transceiver; and
      a plurality of slave dynamic phase alignment circuits that each use the selected clock phase from the master dynamic phase alignment circuit in receiving a respective one of the multiple data signals associated with the transceiver.

2. The integrated circuit defined in claim 1 wherein each slave dynamic phase alignment circuit comprises:
   a dynamic phase alignment detection and recovery circuit that receives one of the data signals and the multiphase dynamic phase alignment clock as inputs and that has a clock output.

3. The integrated circuit defined in claim 1 wherein in each transceiver, each slave dynamic phase alignment circuit comprises:
   a dynamic phase alignment detection and recovery circuit that receives one of the data signals and the multiphase dynamic phase alignment clock as inputs and that has a clock output;
   a synchronizer having a data input, a write clock input and a read clock input; and
   a clock selection multiplexer having an output connected to the write clock input of the synchronizer, having a first input that receives the selected clock phase for the transceiver and having a second input connected to the clock output of the dynamic phase alignment detection and recovery circuit in that slave dynamic phase alignment circuit.

4. The integrated circuit defined in claim 1 wherein the phase-locked-loop circuit produces a serial clock and wherein in each transceiver, each slave dynamic phase alignment circuit comprises:
   a dynamic phase alignment detection and recovery circuit that receives one of the data signals and the multiphase dynamic phase alignment clock as inputs and that has a clock output;
   a synchronizer having a data input, a write clock input and a read clock input; and
   a clock selection multiplexer having an output connected to the read clock input of the synchronizer, having a first input that receives the serial clock from the phase-locked-loop circuit, and having a second input.

5. The integrated circuit defined in claim 1 wherein the phase-locked-loop circuit produces a serial clock and wherein in each transceiver, each slave dynamic phase alignment circuit comprises:
   a dynamic phase alignment detection and recovery circuit that receives one of the data signals and the multiphase dynamic phase alignment clock as inputs and that has a clock output;
   a synchronizer having a data input, a write clock input and a read clock input;
   a first clock selection multiplexer having an output connected to the write clock input of the synchronizer, having a first input that receives the selected clock phase for the transceiver and having a second input connected to the clock output of the dynamic phase alignment detection and recovery circuit in that slave dynamic phase alignment circuit; and
   a second clock selection multiplexer having an output connected to the read clock input of the synchronizer, having a first input that receives the serial clock from the phase-locked-loop circuit, and having a second input connected to the output of the first clock selection multiplexer.

6. The integrated circuit defined in claim 1 wherein the phase-locked-loop circuit produces a serial clock and wherein in each transceiver, each slave dynamic phase alignment circuit comprises:
   a dynamic phase alignment detection and recovery circuit that receives one of the data signals and the multiphase dynamic phase alignment clock as inputs and that has a clock output;
   a synchronizer having a data input, a write clock input and a read clock input;
   a first clock selection multiplexer having an output connected to the write clock input of the synchronizer, having a first input that receives the selected clock phase for the transceiver and having a second input connected to the clock output of the dynamic phase alignment detection and recovery circuit in that slave dynamic phase alignment circuit;
   a second clock selection multiplexer having an output connected to the read clock input of the synchronizer, having a first input that receives the serial clock from the phase-locked-loop circuit, and having a second input connected to the output of the first clock selection multiplexer; and
   a clock divider that is connected to the output of the first clock selection multiplexer.

7. The integrated circuit defined in claim 1 wherein the phase-locked-loop circuit produces a serial clock and wherein in each transceiver, each slave dynamic phase alignment circuit comprises:
   a dynamic phase alignment detection and recovery circuit that receives one of the data signals and the multiphase dynamic phase alignment clock as inputs and that has a clock output;

a synchronizer having a data input that is connected to the respective one of the multiple data signals associated with the transceiver, a write clock input, a read clock input, and a data output;

a first clock selection multiplexer having an output connected to the write clock input of the synchronizer, having a first input that receives the selected clock phase for the transceiver and having a second input connected to the clock output of the dynamic phase alignment detection and recovery circuit in that slave dynamic phase alignment circuit;

a second clock selection multiplexer having an output connected to the read clock input of the synchronizer, having a first input that receives the serial clock from the phase-locked-loop circuit, and having a second input connected to the output of the first clock selection multiplexer;

a deserializer that converts serial data that has passed through the data output of the synchronizer to parallel data, that has a write clock input, and that has a read clock input; and a clock divider that is connected to the clock output of the first clock selection multiplexer, wherein the clock divider provides a divided clock signal for the read clock input of the deserializer.

8. The integrated circuit defined in claim 1 wherein the phase-locked-loop circuit produces a serial clock and wherein in each transceiver, each slave dynamic phase alignment circuit comprises:

a dynamic phase alignment detection and recovery circuit that receives one of the data signals and the multiphase dynamic phase alignment clock as inputs and that has a clock output;

a synchronizer having a data input that is connected to the respective one of the multiple data signals associated with the transceiver, a write clock input, a read clock input, and a data output;

a first clock selection multiplexer having an output connected to the write clock input of the synchronizer, having a first input that receives the selected clock phase for the transceiver and having a second input connected to the clock output of the dynamic phase alignment detection and recovery circuit in that slave dynamic phase alignment circuit;

a second clock selection multiplexer having an output connected to the read clock input of the synchronizer, having a first input that receives the serial clock from the phase-locked-loop circuit, and having a second input connected to the output of the first clock selection multiplexer;

a deserializer that converts serial data that has passed through the data output of the synchronizer to parallel data, that has a write clock input, and that has a read clock input;

a clock divider that is connected to the clock output of the first clock selection multiplexer, wherein the clock divider provides a divided clock signal for the read clock input of the deserializer; and a third clock selection multiplexer having an output connected to the write clock input of the deserializer, having a first input that receives the serial clock from the phase-locked-loop circuit, and having a second input connected to the output of the first clock selection multiplexer.

9. The integrated circuit defined in claim 1 wherein in each transceiver, each master dynamic phase alignment circuit comprises:

a dynamic phase alignment detection and recovery circuit that receives the reference clock associated with the transceiver and the multiphase dynamic phase alignment clock from the phase-locked-loop as inputs, that generates additional clock phases for the multiphase dynamic phase alignment clock from the received multiphase dynamic phase alignment clock, and that has a clock output at which the selected clock phase is provided.

10. The integrated circuit defined in claim 1 wherein the phase-locked-loop circuit produces a serial clock, wherein in each transceiver, each master dynamic phase alignment circuit comprises a dynamic phase alignment detection and recovery circuit that receives the reference clock associated with the transceiver and the multiphase dynamic phase alignment clock from the phase-locked-loop as inputs, that generates additional clock phases for the multiphase dynamic phase alignment clock from the received multiphase dynamic phase alignment clock, and that has a clock output at which the selected clock phase is provided, and wherein in each transceiver, each slave dynamic phase alignment circuit comprises:

a dynamic phase alignment detection and recovery circuit that receives one of the data signals and the multiphase dynamic phase alignment clock as inputs and that has a clock output;

a synchronizer having a data input that receives the respective one of the multiple data signals associated with the transceiver, a write clock input, a read clock input, and a data output;

a first clock selection multiplexer having an output connected to the write clock input of the synchronizer, having a first input that receives the selected clock phase for the transceiver and having a second input connected to the clock output of the dynamic phase alignment detection and recovery circuit in that slave dynamic phase alignment circuit;

a second clock selection multiplexer having an output connected to the read clock input of the synchronizer, having a first input that receives the serial clock from the phase-locked-loop circuit, and having a second input connected to the output of the first clock selection multiplexer;

a deserializer that converts serial data that has passed through the data output of the synchronizer to parallel data, that has a write clock input, and that has a read clock input;

a clock divider that is connected to the clock output of the first clock selection multiplexer, wherein the clock divider provides a divided clock signal for the read clock input of the deserializer; and a third clock selection multiplexer having an output connected to the write clock input of the deserializer, having a first input that receives the serial clock from the phase-locked-loop circuit, and having a second input connected to the output of the first clock selection multiplexer.

11. The integrated circuit defined in claim 1 wherein the phase-locked-loop circuit produces a serial clock and a parallel clock, wherein in each transceiver, each slave dynamic phase alignment circuit comprises a deserializer having a write input receives the serial clock and having a read input that receives the parallel clock.

12. The integrated circuit defined in claim 1 wherein the phase-locked-loop circuit produces a serial clock and a parallel clock, wherein in each transceiver, each slave dynamic phase alignment circuit comprises a deserializer having a write input that receives the serial clock, having a read input that receives the parallel clock, and having a data input to which the respective one of the multiple data signals associated with the transceiver is provided.

13. The integrated circuit defined in claim 1 wherein the phase-locked loop circuit comprises a reference clock input that receives the same reference clock signal as one of the plurality of transceivers.

14. A programmable logic device integrated circuit connected to a plurality of buses, wherein each bus conveys a respective reference clock signal and a respective set of data signals to the programmable logic device integrated circuit from transmitting circuitry that is not located on the programmable logic device integrated circuit, the programmable logic device integrated circuit, comprising:
   a phase-locked-loop circuit that produces a multiphase dynamic phase alignment clock signal; and
   a plurality of transceivers each of which is associated with a respective one of the buses, wherein each transceiver comprises:
      a master dynamic phase alignment circuit that receives the multiphase dynamic phase alignment clock signal from the phase-locked-loop circuit, that receives the reference clock signal corresponding to the bus for that transceiver, and that produces a corresponding selected clock signal; and
      a plurality of slave dynamic phase alignment circuits, each of which receives a respective one of the set of data signals corresponding to the bus for that transceiver and each of which receives the selected clock signal from the master dynamic phase alignment circuit associated with that transceiver.

15. The programmable logic device integrated circuit defined in claim 14 further comprising:
   programmable logic that receives the data signals from the transceivers.

16. The programmable logic device integrated circuit defined in claim 14, wherein each slave dynamic phase alignment circuit comprises a deserializer that converts the respective one of the set of data signals from serial data to parallel data, the programmable logic device integrated circuit further comprising programmable logic that receives the parallel data from the deserializers.

17. The programmable logic device integrated circuit defined in claim 14 wherein in each transceiver, each slave dynamic phase alignment circuit comprises:
   a data input that receives one of the set of data signals corresponding to the bus for that transceiver;
   a deserializer that converts the received data signals from serial data to parallel data; and
   a multiplexer having an output through which the data signals are routed to the deserializer, having a first input that is coupled to the data input, and having a second input.

18. The programmable logic device integrated circuit defined in claim 14 wherein in each transceiver, each slave dynamic phase alignment circuit comprises:
   a synchronizer that has a data input and that has a write clock input that receives the selected clock from the master dynamic phase alignment circuit in the transceiver;
   an input line that receives one of the set of data signals corresponding to the bus for that transceiver;
   a deserializer that converts the received data signals from serial data to parallel data; and
   a multiplexer having an output through which the data signals are routed to the deserializer, having a first input that is coupled to the input line, and having a second input that is coupled to the data input of the synchronizer.

19. Circuitry on a programmable logic device integrated circuit comprising:
   a phase-locked-loop circuit that receives a first reference clock as an input and that provides as outputs a multiphase dynamic phase alignment clock, a serial clock at a serial clock output, and a parallel clock;
   a master dynamic phase alignment circuit that receives a second reference clock and the multiphase dynamic phase alignment clock as inputs, that uses the second reference clock in selecting an optimal phase from the multiple phases of the multiphase dynamic phase alignment clock, and that provides the optimal phase as a selected clock output signal on a selected clock output; and
   a plurality of slave dynamic phase alignment circuits, each of which includes:
      a dynamic phase alignment detection and recovery circuit that receives a data signal and the multiphase dynamic phase alignment clock as inputs and that has a clock output;
      a synchronizer having a data input, a write clock input and a read clock input;
      a first clock selection multiplexer having an output connected to the write clock input of the synchronizer and having inputs connected to the clock output of the dynamic phase alignment detection and recovery circuit and to the selected clock output of the master dynamic phase alignment circuit; and
      a second clock selection multiplexer having an output connected to the read clock input of the synchronizer and having inputs connected to the serial clock output of the phase-locked-loop circuit and the output of the first clock selection multiplexer.

20. The circuitry defined in claim 19 wherein each slave dynamic phase alignment circuit further comprises a deserializer having a write clock input that receives the serial clock and a read clock input that receives the parallel clock, wherein the deserializer converts the data signal received by the dynamic phase alignment detection and recovery circuit to parallel data.

\* \* \* \* \*